(12) United States Patent
Gutierrez

(10) Patent No.: US 9,414,495 B2
(45) Date of Patent: *Aug. 9, 2016

(54) SURFACE MOUNT ACTUATOR

(71) Applicant: DigitalOptics Corporation MEMS, Arcadia, CA (US)

(72) Inventor: Roman C. Gutierrez, Arcadia, CA (US)

(73) Assignee: DIGITALOPTICS CORPORATION MEMS, Arcadia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/065,299

(22) Filed: Oct. 28, 2013

(65) Prior Publication Data

US 2014/0055971 A1    Feb. 27, 2014

Related U.S. Application Data

(63) Continuation of application No. 13/247,938, filed on Sep. 28, 2011, now Pat. No. 8,571,405.

(51) Int. Cl.
  *G03B 3/10* (2006.01)
  *G03B 13/34* (2006.01)
  *G01R 31/02* (2006.01)
  *H05K 1/18* (2006.01)
  (Continued)

(52) U.S. Cl.
  CPC ............ *H05K 1/181* (2013.01); *B81B 7/0054* (2013.01); *B81C 3/008* (2013.01); *B81B 2201/038* (2013.01); *B81B 2201/047* (2013.01); *B81B 2203/0163* (2013.01); *B81B 2203/053* (2013.01); *B81B 2203/055* (2013.01); *B81B 2207/07* (2013.01)

(58) Field of Classification Search
  CPC ............... B81B 2201/047; B81B 2203/053; B81B 2201/038; B81B 2203/055; B81B 3/0037; B81B 3/0051; B81B 7/0054; B81B 2207/07; B81B 2203/0163; G03B 3/10; G03B 2205/0046; G03B 2205/0069; G03B 5/00; G03B 2205/0007; G03B 2205/0084; G02B 6/3566; G02B 6/3576; G02B 6/359; H05K 1/181; B81C 3/008
  USPC ................................. 438/112–122
  See application file for complete search history.

(56) References Cited

U.S. PATENT DOCUMENTS

| | | | |
|---|---|---|---|
| 4,333,722 | A | 6/1982 | Lee |
| 4,384,778 | A | 5/1983 | Lee et al. |
| 4,408,857 | A | 10/1983 | Frank |

(Continued)

FOREIGN PATENT DOCUMENTS

WO    WO 2010/138931    12/2010

OTHER PUBLICATIONS

Akihiro Koga et al. "Electrostatic Linear Microactuator Mechanism for Focusing a CCD Camera"; Journal of Lightwave Technology, vol. 17, No. 1: p. 43-47; Jan. 1999.

(Continued)

*Primary Examiner* — Marc Armand
*Assistant Examiner* — Nelson Garces
(74) *Attorney, Agent, or Firm* — Haynes and Boone, LLP

(57) ABSTRACT

A silicon MEMS device can have at least one solder contact formed thereupon. The silicon MEMS device can be configured to be mounted to a circuit board via the solder contact(s). The silicon MEMS device can be configured to be electrically connected to the circuit board via the solder contact(s).

18 Claims, 6 Drawing Sheets

(51) Int. Cl.
*B81B 7/00* (2006.01)
*B81C 3/00* (2006.01)

(56) References Cited

U.S. PATENT DOCUMENTS

| | | | |
|---|---|---|---|
| 4,496,217 A | 1/1985 | Aoyagi | |
| 4,716,432 A | 12/1987 | Stephany | |
| 4,860,040 A | 8/1989 | Tamamura et al. | |
| 5,150,260 A | 9/1992 | Chigira | |
| 5,386,294 A | 1/1995 | Ototake et al. | |
| 5,699,621 A | 12/1997 | Trumper et al. | |
| 5,825,560 A | 10/1998 | Ogura et al. | |
| 5,986,826 A | 11/1999 | Kosaka et al. | |
| 5,995,688 A | 11/1999 | Askyuk et al. | |
| 6,033,131 A | 3/2000 | Ghosh | |
| 6,068,801 A | 5/2000 | Bodo et al. | |
| 6,205,267 B1 | 3/2001 | Aksyuk et al. | |
| 6,262,827 B1 | 7/2001 | Ueda et al. | |
| 6,392,703 B1 | 5/2002 | Uchino et al. | |
| 6,426,777 B1 | 7/2002 | Sato | |
| 6,497,141 B1 | 12/2002 | Turner et al. | |
| 6,535,311 B1 | 3/2003 | Lindquist | |
| 6,674,383 B2 | 1/2004 | Horsley et al. | |
| 6,675,671 B1 | 1/2004 | Jokiel et al. | |
| 6,847,907 B1 | 1/2005 | Novotny | |
| 6,850,675 B1 | 2/2005 | Calvet et al. | |
| 6,914,635 B2 | 7/2005 | Ostergard | |
| 6,958,777 B1 | 10/2005 | Pine | |
| 7,027,206 B2 | 4/2006 | Mochizuki | |
| 7,038,150 B1 | 5/2006 | Polosky et al. | |
| 7,113,688 B2 | 9/2006 | Calvet et al. | |
| 7,154,199 B2 | 12/2006 | Yasuda | |
| 7,266,272 B1 | 9/2007 | Calvet et al. | |
| 7,285,879 B2 | 10/2007 | Osaka | |
| 7,372,074 B2 | 5/2008 | Milne et al. | |
| 7,436,207 B2 | 10/2008 | Rogers et al. | |
| 7,477,842 B2 | 1/2009 | Gutierrez | |
| 7,545,591 B1 | 6/2009 | Tong et al. | |
| 7,555,210 B2 | 6/2009 | Calvet | |
| 7,579,848 B2 | 8/2009 | Bottoms et al. | |
| 7,646,969 B2 | 1/2010 | Calvet et al. | |
| 7,705,909 B2 | 4/2010 | Ishizawa et al. | |
| 7,720,366 B2 | 5/2010 | Iwasaki et al. | |
| 7,838,322 B1 | 11/2010 | Vargo et al. | |
| 7,855,489 B2 | 12/2010 | Hirano | |
| 7,990,628 B1 | 8/2011 | Calvet et al. | |
| 8,004,780 B2 | 8/2011 | Gutierrez et al. | |
| 8,178,936 B2 | 5/2012 | Zhe et al. | |
| 8,299,598 B2 | 10/2012 | Moden | |
| 8,571,405 B2 * | 10/2013 | Gutierrez | B81B 7/0054 174/84 R |
| 2001/0004420 A1 | 6/2001 | Kuwana et al. | |
| 2002/0006687 A1 | 1/2002 | Lam | |
| 2002/0070634 A1 | 6/2002 | Tai et al. | |
| 2002/0105699 A1 | 8/2002 | Miracky et al. | |
| 2002/0125789 A1 | 9/2002 | Brandt | |
| 2003/0048036 A1 | 3/2003 | Lemkin | |
| 2003/0062422 A1 | 4/2003 | Fateley et al. | |
| 2003/0076421 A1 | 4/2003 | Dutta | |
| 2003/0086751 A1 | 5/2003 | Culpepper | |
| 2003/0210116 A1 | 11/2003 | Lane et al. | |
| 2004/0048410 A1 | 3/2004 | O'Brien et al. | |
| 2004/0066494 A1 | 4/2004 | Lee et al. | |
| 2004/0183936 A1 | 9/2004 | Kim et al. | |
| 2004/0189969 A1 | 9/2004 | Mizuno | |
| 2004/0201773 A1 | 10/2004 | Ostergard | |
| 2005/0002008 A1 | 1/2005 | De Weerdt et al. | |
| 2005/0002086 A1 | 1/2005 | Starkweather et al. | |
| 2005/0007489 A1 | 1/2005 | Ahn et al. | |
| 2005/0095813 A1 | 5/2005 | Zhu et al. | |
| 2005/0139542 A1 | 6/2005 | Dickensheets et al. | |
| 2005/0148433 A1 | 7/2005 | Wang et al. | |
| 2005/0219399 A1 | 10/2005 | Sato et al. | |
| 2005/0249487 A1 * | 11/2005 | Gutierrez | 396/85 |
| 2006/0028320 A1 | 2/2006 | Osaka | |
| 2006/0033938 A1 | 2/2006 | Kopf et al. | |
| 2006/0183332 A1 | 8/2006 | Kang | |
| 2006/0186906 A1 * | 8/2006 | Bottoms | G01R 1/0483 324/755.05 |
| 2006/0192858 A1 | 8/2006 | Calvet | |
| 2006/0193618 A1 | 8/2006 | Calvet | |
| 2006/0204242 A1 | 9/2006 | Gutierrez et al. | |
| 2006/0209012 A1 | 9/2006 | Hagood | |
| 2006/0219006 A1 | 10/2006 | Nasiri et al. | |
| 2006/0250325 A1 | 11/2006 | Hagood et al. | |
| 2007/0133976 A1 | 6/2007 | Gutierrez et al. | |
| 2008/0020573 A1 | 1/2008 | Birkmeyer et al. | |
| 2008/0044172 A1 | 2/2008 | Tang et al. | |
| 2008/0075309 A1 * | 3/2008 | Chen et al. | 381/175 |
| 2008/0314040 A1 * | 12/2008 | Messner et al. | 60/528 |
| 2010/0026331 A1 * | 2/2010 | Chong | G01R 1/07342 324/754.03 |
| 2010/0232777 A1 | 9/2010 | Tseng et al. | |
| 2010/0284081 A1 | 11/2010 | Gutierrez et al. | |
| 2011/0026148 A1 | 2/2011 | Tanimura et al. | |

OTHER PUBLICATIONS

Chapter 2: Electrical Microactuators, Apr. 11, 2005.
Polymems Actuator: A Polymer-Based Microelectromechanical (MEMS) Actuator with Macroscopic Action, Honeywell International Incorporated, Final Technical Report, Sep. 2002.
Measuring Capacitance: Methods (fwd); Apr. 26, 1998 http://www.pupman.com/listarchives/1998/April/msg00625.html.
Fernandez et al., Pulse-Drive and Capacitive Measurement Circuit for MEMS Electrostatic Actuators, Stresa, Italy, Apr. 25-27, 2007.
Improving Test Efficiency of MEMS Electrostatic Actuators Using the Agilent E4980A Precision LCR Meter, Agilent Technologies, Inc., Apr. 12, 2007.

* cited by examiner

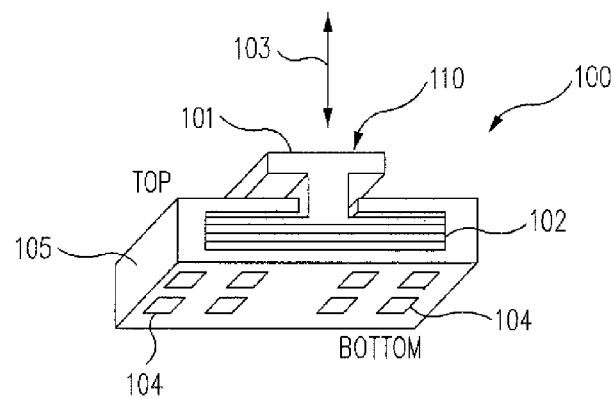
FIG. 1
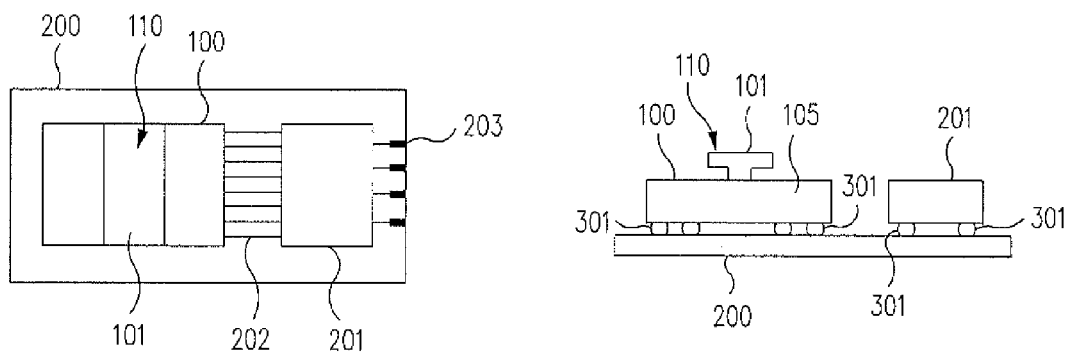
FIG. 2
FIG. 3

SURFACE MOUNT ACTUATOR

CROSS REFERENCE TO RELATED APPLICATIONS

This application is a continuation of U.S. patent application Ser. No. 13/247,938 filed Sep. 28, 2011, which is incorporated herein by reference in its entirety as part of the present disclosure.

TECHNICAL FIELD

One or more embodiments relate generally to microelectromechanical systems (MEMS) and, more particularly, to the surface mounting of MEMS actuators.

BACKGROUND

Microelectromechanical systems (MEMS) actuators are well known. Examples of MEMS actuators include comb drives, scratch drives, and thermal drives. MEMS actuators can be used in a variety of applications.

MEMS actuators are generally mounted upon a substrate. For example, it can be desirable to mount a MEMS actuator to a printed circuit board (PCB) or the like. It is not always possible to package a MEMS actuator in a standard integrated circuit (IC) package. Standard integrated circuit packages can interfere with external moving parts of a MEMS actuator and thus prevent proper operation of the MEMS actuator.

As a result, there is a need for improved methods and systems for mounting MEMS actuators, such as to printed circuit boards and the like, for example.

SUMMARY

In accordance with an embodiment, a silicon MEMS device can have at least one solder contact formed thereupon. The silicon MEMS device can be configured to be mounted to a circuit board via the solder contact(s). The silicon MEMS device can be configured to be electrically connected to the circuit board via the solder contact(s).

In accordance with an embodiment, a microelectromechanical systems (MEMS) actuator can have a plurality of electrical contacts, e.g. solder contacts, formed upon a corresponding plurality of flexures thereof for facilitating electrical communication with the MEMS actuator. The electrical contacts can be configured to facilitate surface mounting of the MEMS actuator, such as upon a printed circuit board, a flexible circuit, or the like. The flexures can mitigate stress applied to the MEMS actuator.

In accordance with another embodiment, a system can have a circuit board, a MEMS actuator, and a miniature camera. The MEMS actuator can be surface mounted to the circuit board via flexures of the MEMS actuator. The MEMS actuator can be configured to move an optical element, such as a lens, of the miniature camera.

In accordance with another embodiment, a method can include applying solder to pads of a circuit board, such as by using a solder mask. A MEMS actuator can be placed upon the circuit board in a desired orientation. The MEMS actuator can be placed upon the circuit board such that contacts of MEMS actuator that are formed on flexures are substantially aligned with the pads of the circuit board. The MEMS actuator can be reflow soldered to the circuit board.

Thus, according to various embodiments, methods and systems are provided for mounting a MEMS actuator when the MEMS actuator is not packaged in a contemporary integrated circuit package. More particularly, such methods and system facilitate electrical connection to the MEMS actuator in a manner that mitigates stress applied to the MEMS actuator.

The scope of the invention is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 1 is a perspective view of a surface mount actuator configured to attach to a circuit board with an arm of the actuator extending upwardly, in accordance with an embodiment.

FIG. 2 is a top view of the surface mount actuator of FIG. 1 mounted to the circuit board, in accordance with an embodiment.

FIG. 3 is a side view of the surface mount actuator of FIG. 1 mounted to the circuit board, in accordance with an embodiment.

Embodiments of the invention and their advantages are best understood by referring to the detailed description that follows. It should be appreciated that like reference numerals are used to identify like elements illustrated in one or more of the figures.

DETAILED DESCRIPTION

Systems and methods are disclosed herein to provide for the surface mounting of actuators. Embodiments of the actuators can be mounted in different orientations. Thus, the actuators can be more readily used in a variety of applications.

Actuators typically have external moving parts. Contemporary packaging technologies, such as ball grid array (BGA) and quad flat no-lead (QFN), cannot readily be used with surface mount technology (SMT) to mount actuators because the packaging technology can interfere with desired operation of the actuator. That is, the packaging technology can interfere with movement of the external moving parts.

It is desirable to isolate actuators, such as MEMS actuators, from stress. Stress can adversely affect the operation of such actuators. Mounting flexures can be provided to accommodate such stress. Electrical contacts can be formed upon such flexures. The electrical contacts can be solder contacts, for example.

FIG. 1 is a perspective view of a surface mount actuator 100, according to an embodiment. The surface mount actuator 100 is configured to attach to a circuit board 200 (see FIG. 2) using surface mount technology, as discussed herein.

A plunger, ram, or arm 101 of the actuator 100 extends upwardly, in accordance with an embodiment. Thus, the actuator 100 shown in FIG. 1 can be oriented so as to provide up and down movement, i.e., movement in the directions indicated by arrow 103. That is, the arm 101 can move back and forth in the directions indicated by arrow 103. The arm 101 can thus move other items in these directions with minimal or no intermediate linkage.

Figure 11:
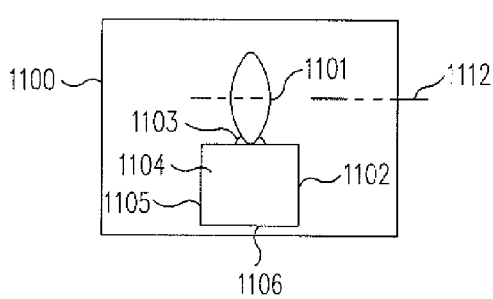
FIG. 11 is a side view of a lens and lens mount configured for use with the surface mount actuator, in accordance with an embodiment.
Figure 12:
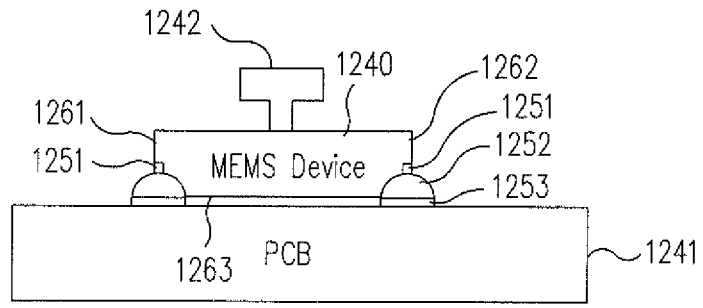
FIG. 12 is a side view of the surface mount actuator having contacts that extend across two surfaces thereof, in accordance with an embodiment.

The actuator 100 can be used in a variety of applications, such as to move an optical element in a miniature camera 1100 (FIGS. 11 and 12). For example, one or more of the actuators 100 can be used to move a lens 1101 (FIGS. 11 and 12) to effect focusing of the miniature camera 1100, to effect zooming of the miniature camera 1100, and/or to effect optical image stabilization for the miniature camera 1100. The arm 101 can define a platform, substrate, or lens mount to facilitate the attachment of the lens 1101 thereto. The arm 101 can attach directly to the lens 1101 or can attach to the lens 1101 via a lens mount 1102.

The actuator 100 can be a microelectromechanical systems (MEMS) actuator. For example, the actuator 100 can be an electrostatic actuator. The actuator 100 can have a plurality of plates, fingers, or electrodes 102. The electrodes 102 shown in FIG. 1 can represent various MEMS actuator structures. The electrodes 102 shown in FIG. 1 can represent rows of fingers, for example. The electrodes 102 can be substantially surrounded by a housing or frame 105.

FIG. 2 is a top view of the actuator 100 of FIG. 1 mounted to the circuit board 200, in accordance with an embodiment. The actuator 100 can be surface mounted to the circuit board 200 using contacts 104 (FIG. 1). The contacts 104 can be flat contacts, leads, pins, solder balls, or any other type of surface mount contacts. Thus, the actuator 100 can be mounted to the circuit board 200 using any of a variety of surface mounting techniques.

The circuit board 200 can be a printed circuit board or a flexible circuit, for example. The circuit board 200 can be any type of substrate or material that is suitable for surface mounting of the actuator 100.

An actuator driver 201 can be in electrical communication with the actuator 100. For example, traces 202 formed upon the circuit board 200, can facilitate such electrical communication. Traces, pads or edge connectors 203 can facilitate communication of the driver 201 with other circuitry. For example, the edge connectors 203 can facilitate communication of the driver 201 with a controller, such as a microprocessor, that can be used to facilitate autofocus and/or optical image stabilization. The driver 201 can be located off of the circuit board 200.

FIG. 3 is a side view of the actuator 100 of FIG. 1 mounted to the circuit board 200, in accordance with an embodiment. Solder paste or solder balls 301 can electrically and mechanically attach the actuator 100 and the driver 201 to the circuit board 200 using surface mount technology.

Figure 4:
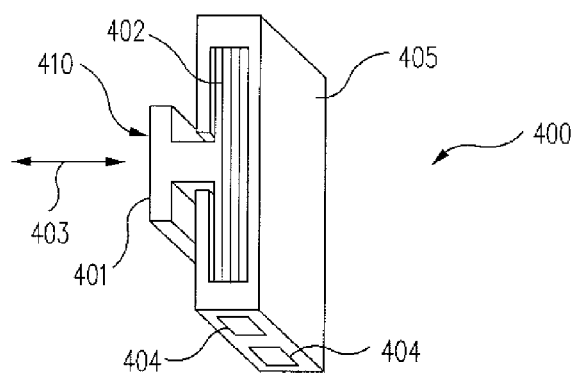
FIG. 4 is a perspective view of a surface mount actuator configured to attach to a circuit board with an arm of the actuator extending sideways, in accordance with an embodiment.

FIG. 4 is a perspective view of a surface mount actuator 400 configured to attach to a circuit board 500 (see FIG. 5) using surface mount technology, as discussed herein.

An arm 401 of the actuator 400 extends sideways, in accordance with an embodiment. Thus, the actuator 400 shown in FIG. 4 can be oriented so as to provide side-to-side movement, i.e., movement in the directions indicated by arrow 403. That is, the arm 401 can move back and forth in the directions indicated by arrow 403. The arm 401 can thus move other items in these directions with minimal or no intermediate linkage.

The actuator 400 can be used in a variety of applications, such as to move an optical element in the miniature camera 1100 (FIG. 12). For example, one or more of the actuators 400 can be used to move the lens 1101 (FIGS. 11 and 12) to effect focusing of the miniature camera 1100, to effect zooming of the miniature camera 1100, and/or to effect optical image stabilization for the miniature camera 1100. The arm 401 can define a platform, substrate, or lens mount to facilitate the attachment of the lenses 1101 thereto. The arm 401 can attach directly to a lens 1101 or can attach to the lens 1101 via a lens mount 1102.

The actuator 400 can be a microelectromechanical systems (MEMS) actuator. For example, the actuator 400 can be an electrostatic actuator. The actuator 400 can have a plurality of plates, fingers, or electrodes 402. The electrodes 402 shown in FIG. 4 can represent various MEMS actuator structures. The electrodes 402 shown in FIG. 4 can represent rows of fingers, for example. The electrodes 402 can be substantially surrounded by a housing or frame 405.

Figure 5:
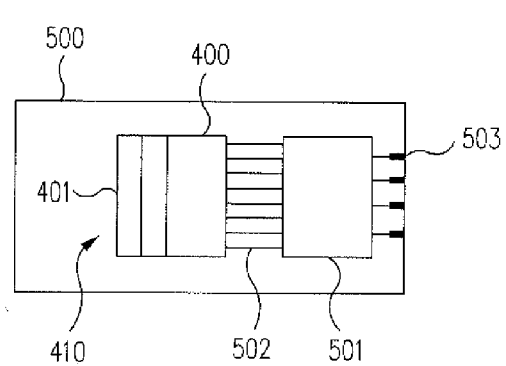
FIG. 5 is a top view of the surface mount actuator of FIG. 4 mounted to the circuit board, in accordance with an embodiment.

FIG. 5 is a top view of the actuator 400 of FIG. 4 mounted to the circuit board 500, in accordance with an embodiment. The actuator 400 can be surface mounted to the circuit board 500 using contacts 404 (FIG. 4). The contacts 404 can be flat contacts, leads, pins, solder balls, or any other type of surface mount contacts. Thus, the actuator 400 can be mounted to the circuit board 500 using any of a variety of surface mounting techniques.

The circuit board 500 can be a printed circuit board or a flexible circuit, for example. The circuit board 500 can be any type of substrate or material that is suitable for surface mounting of the actuator 400.

An actuator driver 501 can be in electrical communication with the actuator 100. For example, traces 502 formed upon the circuit board 500, can facilitate such electrical communication. Traces, pads or edge connectors 503 can facilitate communication of the driver 501 with other circuitry. The driver 501 can be located off of the circuit board 500.

Figure 6:
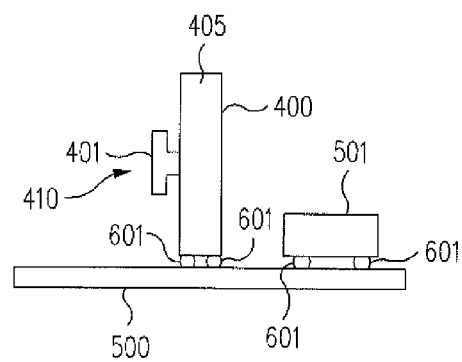
FIG. 6 is a side view of the surface mount actuator of FIG. 4 mounted to the circuit board, in accordance with an embodiment.

FIG. 6 is a side view of the actuator 400 of FIG. 1 mounted to the circuit board 500, in accordance with an embodiment. Solder paste or solder balls 601 can electrically and mechanically attach the actuator 400 and the driver 501 to the circuit board 500 using surface mount technology.

Figure 7:
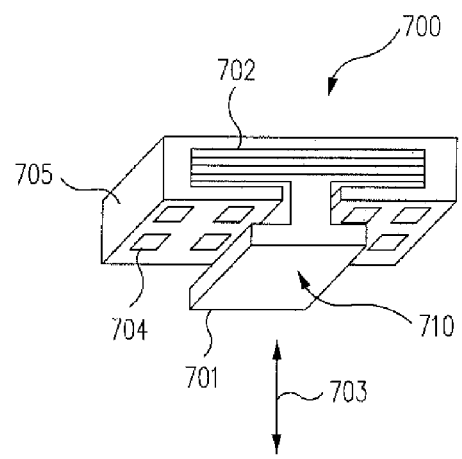
FIG. 7 is a perspective view of a surface mount actuator configured to attach to a circuit board with an arm of the actuator extending downwardly, in accordance with an embodiment.

FIG. 7 is a perspective view of a surface mount actuator 700 configured to attach to a circuit board 800 (see FIG. 8) using surface mount technology, as discussed herein.

An arm 701 of the actuator 700 extends downwardly, in accordance with an embodiment. Thus, the actuator 700 shown in FIG. 7 can be oriented so as to provide up and down movement, i.e., movement in the directions indicated by arrow 703. That is, the arm 701 can move back and forth in the directions indicated by arrow 703. The arm 701 can thus move other items in these directions with minimal or no intermediate linkage.

The actuator 700 can be used in a variety of applications, such as to move an optical element in the miniature camera 1100 (FIGS. 11 and 12). For example, one or more of the actuators 700 can be used to move a lens 1101 (FIGS. 11 and 12) to effect focusing of the miniature camera 110o, to effect zooming of the miniature camera 1100, and/or to effect optical image stabilization for the miniature camera 1100. The arm 701 can define a platform, substrate, or lens mount 1102 to facilitate the attachment of the lens 1101 thereto. The arm 701 can attach directly to a lens or can attach to the lens 1101 via a lens mount 1102.

The actuator 700 can be a microelectromechanical systems (MEMS) actuator. For example, the actuator 700 can be an electrostatic actuator. The actuator 700 can have a plurality of plates, fingers, or electrodes 702. The electrodes 702 shown in FIG. 7 can represent various MEMS actuator structures. The electrodes 702 shown in FIG. 7 can represent rows of fingers, for example. The electrodes 702 can be substantially surrounded by a housing or frame 705.

Figure 8:
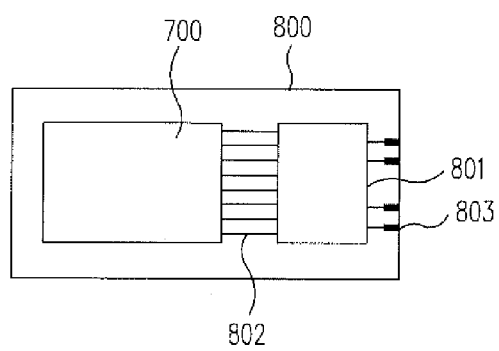
FIG. 8 is a top view of the surface mount actuator of FIG. 7 mounted to the circuit board, in accordance with an embodiment.

FIG. 8 is a top view of the actuator 700 of FIG. 7 mounted to the circuit board 800, in accordance with an embodiment. The actuator 700 can be surface mounted to the circuit board 800 using contacts 704 (FIG. 4). The contacts 704 can be flat contacts, leads, pins, solder balls, or any other type of surface mount contacts. Thus, the actuator 700 can be mounted to the circuit board 800 using any of a variety of surface mounting techniques.

The circuit board 800 can be a printed circuit board or a flexible circuit, for example. The circuit board 800 can be any type of substrate or material that is suitable for surface mounting of the actuator 700.

An actuator driver 801 can be in electrical communication with the actuator 700. For example, traces 802 formed upon the circuit board 800, can facilitate such electrical communication. Traces, pads or edge connectors 803 can facilitate communication of the driver 801 with other circuitry. The driver 801 can be located off of the circuit board 800.

Figure 9:
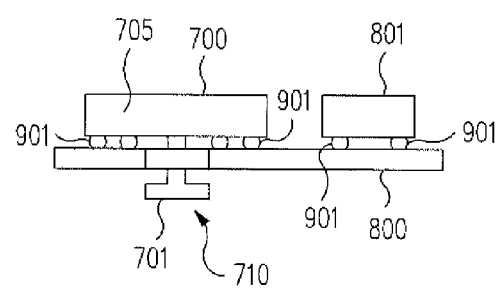
FIG. 9 is a side view of the surface mount actuator of FIG. 7 mounted to the circuit board, in accordance with an embodiment.

FIG. 9 is a side view of the actuator 700 of FIG. 7 mounted to the circuit board 800, in accordance with an embodiment. Solder paste or solder balls 901 can electrically and mechanically attach the actuator 700 and the driver 801 to the circuit board 800 using surface mount technology.

Figure 10:
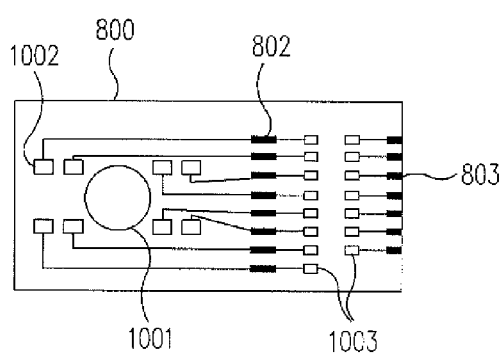
FIG. 10 is a top view of the circuit board of FIG. 8, in accordance with an embodiment.

FIG. 10 is a top view of the circuit board 800 of FIG. 8, in accordance with an embodiment. The circuit board 800 can have an opening 1001 formed therein. The opening 1001 can be generally circular (as shown), square, rectangular, oval, or any other shape.

Pads 1002 can be formed upon the circuit board 800 to facilitate surface mounting of the actuator 700 the circuit board 800. Pads 1003 can be formed upon the circuit board 800 to facilitate surface mounting of the driver 801 to the circuit board 800. The traces 802 can provide electrical communication between the pads 1002 and at least some of the pads 1003.

FIG. 11 is a side view of a lens 1101 and a lens mount 1102 configured for use with the actuator 100, 400, 700, in accordance with an embodiment. The lens 1101 and the lens mount 1102 can be used in a miniature camera 1100, for example. The lens 1101 can be attached to the lens mount 1102 with epoxy 1103, for example. The lens 1101 can be attached to the lens mount 1102 in any desired fashion. The lens mount 1102 can have a plurality of faces, such as faces 1104, 1105 and 1106, for example.

The lens mount 1102 can be configured such that a desired one of the faces, 1104, 1105, or 1106 can be attached to the surface 110, 410, 710 of the arm 101, 401, 701. In this manner the lens 1101 can be attached to the actuator 100, 400, 700 with an orientation that facilitates desire movement of the lens.

For example, the lens mount 1102 can be attached to the arm 101 (FIG. 1) such that face 1105 is in contact with surface 110 of arm 101. Such attachment can facilitate movement of lens 101 along its optical axis 1112 in the direction of arrow 103 (FIG. 1) so as to effect focusing and/or zooming of a miniature camera.

As a further example, the lens mount 1102 can be attached to the arm 401 (FIG. 6) such that face 1104 is in contact with surface 410 of arm 401. Such attachment can facilitate movement of lens 101 perpendicular to its optical axis 1112 so as to effect optical image stabilization for a miniature camera.

The lens mount 1102 can be attached to the arm 401 with epoxy, for example. The lens mount 1102 can be attached to the arm 101, 401, 701 at any desired angle and need not necessarily be attached such that the optical axis 1112 of the lens 1101 is either parallel to or perpendicular to the direction of motion of the actuator 100, 400, 700.

FIG. 12 is a side view of the surface mount actuator 1240 that has been surface mounted to a substrate 1241, such as a printed circuit board. The actuator 1240 can have contacts 1251 that extend across two surfaces of the actuator 1240, in accordance with an embodiment. Each contact 1251 can extend across both a side 1261, 1262 and a bottom 1263 of the actuator 1240. In this manner more reliable electrical and mechanical connection with corresponding pads 1253 of the substrate 1241 can be facilitated. Thus, solder 1252 can have more surface area with which to bond and provide electrical and mechanical connection.

Various embodiments can have such contacts 1251 that extend across two or more surfaces thereof. For example, any of the actuators 100, 400, and 700 can have contacts 1251 that extend across two or more surfaces thereof.

An arm 1242 can extend from the top of the actuator 1240. Alternatively, the arm 1242 can extend from a side of the actuator or can extend from the bottom thereof, as discussed herein.

Figure 13:
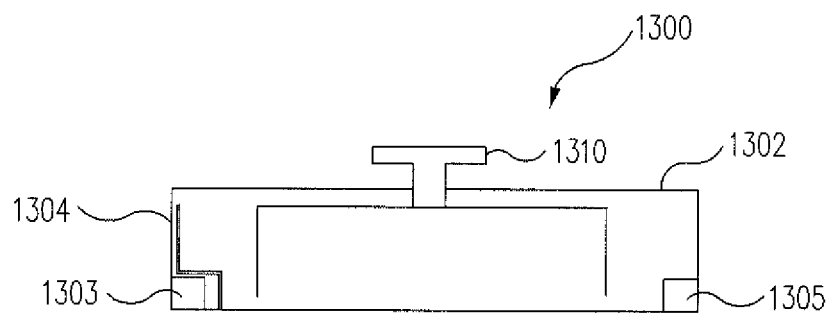
FIG. 13 is a side view of a surface mount actuator having electrical contacts on flexures, in accordance with an embodiment.

FIG. 13 is a side view of a surface mount actuator 1300 having an electrical contact 1303 formed on a flexure 1304, in accordance with an embodiment. The flexure 1304 can tend to isolate the MEMS actuator 1300 from stress caused by the surface mounting process. The flexure 1304 can tend to isolate the MEMS actuator 1300 from stress caused by a difference of the coefficient of thermal expansion (CTE) between the actuator 1300 and the substrate upon which the actuator 1300 is mounted.

An arm 1310 can extend from the top of the actuator 1300, as shown in FIG. 13. Alternatively, the arm 1310 can extend from a side of the actuator 1300 (e.g., the actuator 1300 can be configured to be mounted sideways), or can extend from the bottom of the actuator 1300 (e.g., the actuator 1300 can be configured to be mounted upside down), as discussed herein.

Electrodes 1302 of the actuator 1300 can effect actuation thereof. Any type of electrodes 1302 can be used to define any type of actuator.

One or more of the contacts 1305 can be fixed, i.e., can lack a flexure 1304. Any desired combination of contacts 1303 having flexures 1304 and contacts 1305 lacking flexures can be used. Thus, mechanical isolation from stress can be provided in any desired direction and for any desire contacts 1303.

Figure 14:
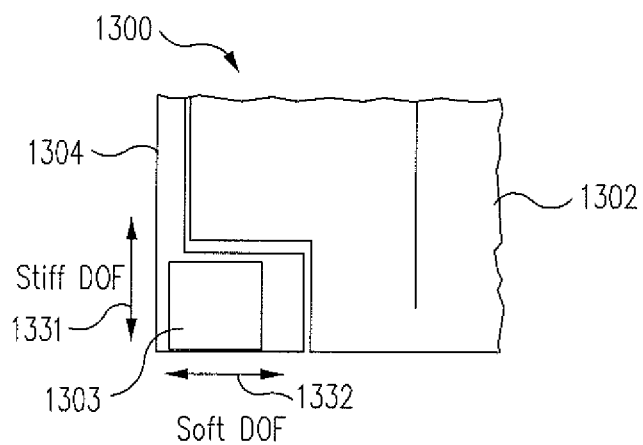
FIG. 14 is an enlarged view of the flexure and contact of FIG. 13, in accordance with an embodiment.

FIG. 14 is an enlarged view of the flexure 1304 and contact 1303 of FIG. 13, in accordance with an embodiment. The flexure 1304 can be comparatively stiff along its longitudinal direction, as indicated by arrow 1331. The flexure 1304 can be comparatively soft along one or more of its transverse directions, as indicated by arrow 1332. The flexures 1304 can be configured to be soft in any desired direction and can be configured to be stiff in any desired direction.

Generally, it is desirable that the stiff direction of the flexures 1304 be along the direction of motion of the actuator 100, 400, 700, so as to facilitate operation of the actuator 100, 400, 700 without loss of motion due to flexing of the flexures 1304. The flexures 1304 can be soft in any or all other directions.

Figure 15:
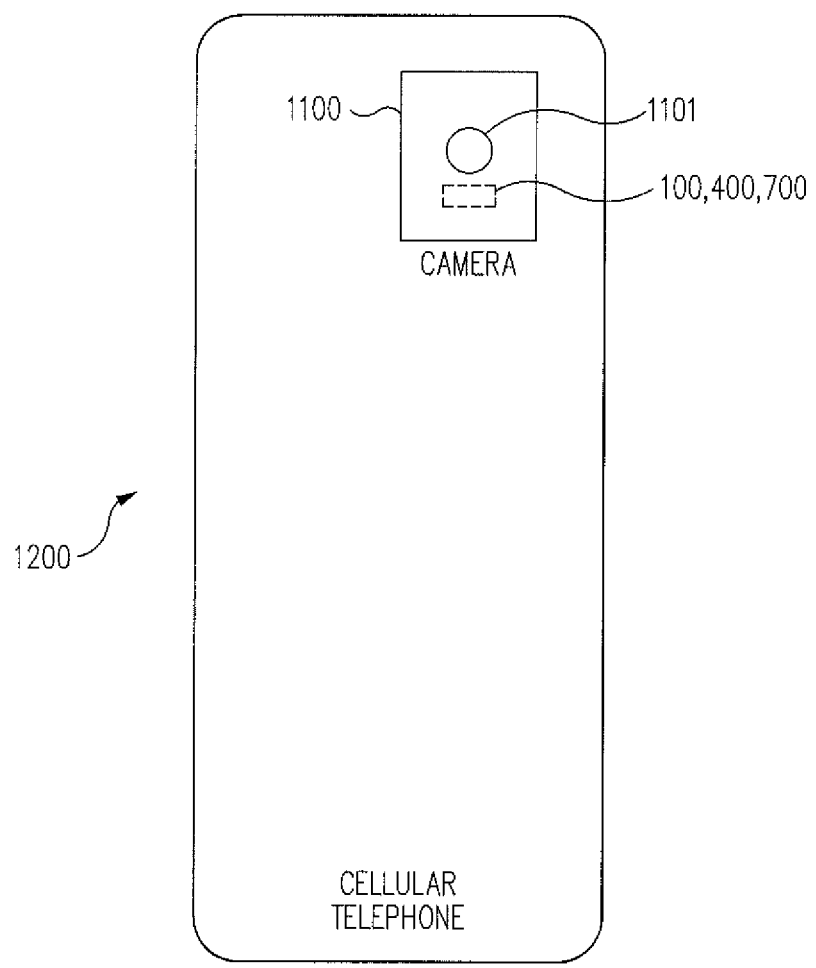
FIG. 15 is a front view of a cellular telephone having a miniature camera, wherein the miniature camera has an actuator, in accordance with an embodiment.

FIG. 15 is a front view of a cellular telephone 1200 having a miniature camera 1100, wherein the miniature camera 1100 has an actuator 100, 400, 700, in accordance with an embodiment. The actuator 100, 400, 700 can move an optical element, such as the lens 1101, so as to effect focus (either manual focus or autofocus), zoom, and/or optical image stabilization.

The miniature camera 1100 can have any desire number of actuators 100, 400, 700 in any desired combination. For example, the miniature camera 1100 can have one actuator 100, 400, 700 dedicated to focusing, one actuator 100, 400, 700 dedicated zooming, and two actuators 100, 400, 700 dedicated to optical image stabilization. The actuators 100, 400, 700 dedicated to focusing and zooming can move one or more lenses, such as lens 1101, along their optical axes. The actuators 100, 400, 700 dedicated optical image stabilization can move one or more lenses, such as lens 1101, approximately perpendicular to their optical axes.

Figure 16:
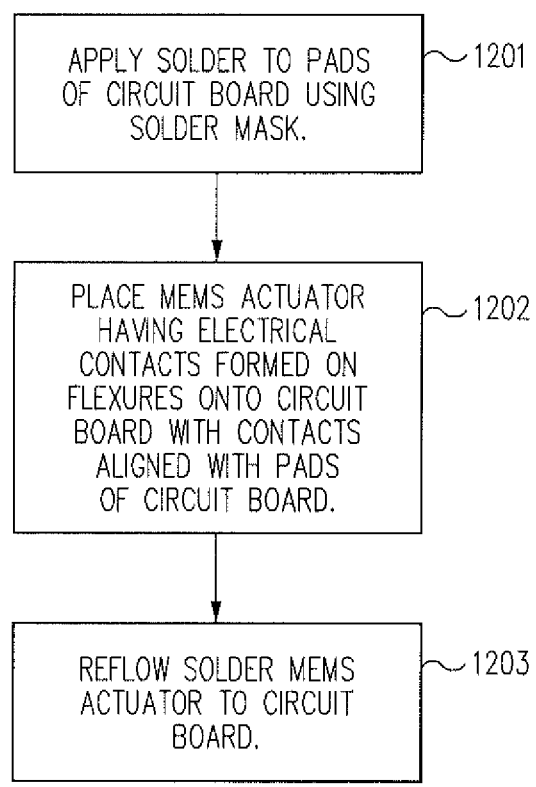
FIG. 16 is a flow chart of a method for surface mounting an actuator, in accordance with an embodiment.

FIG. 16 is a flow chart of a method for surface mounting an actuator 100, 400, 700, in accordance with an embodiment. Solder can be applied to the pads (such as 1002 of FIG. 10) of the circuit board 200, 500, 800 using a solder mask, as indicated in block 1201. Alternatively, the solder can be applied to the contacts 104, 404, 704 of the actuator 100, 400, 700.

The actuator 100, 400, 700 can be placed on the circuit board 200, 500, 800, as indicated in block 1202. The actuator 100, 400, 700 can be unpackaged, e.g., not contained within a contemporary integrated circuit package such as a ball grid array package or a quad flat no-lead package. The actuator 100, 400, 700 can be placed on the circuit board 200, 500, 800 with the contacts 104, 404, 704 of the actuator 100, 400, 700 aligned with the pads (such as 1002 of FIG. 10) of the circuit board 200, 500, 800. The contacts can be formed upon flexures 1304 of the actuator 100, 400, 700.

The actuator 100, 400, 700 can be placed on the circuit board 200, 500, 800 in various orientations, as indicated in block 1203. For example, the actuator 100 can be placed on the circuit board 200, 400, 700 with the arm 101 extending upwardly, away from the circuit board 200, as shown in FIGS. 2 and 3. The actuator 100, 400, 700 can be placed on the circuit board 200, 500, 800 in any desired orientation, including non-perpendicular orientations such as at 30°, 45°, and 60° (as measured between any desired feature of the actuator 100, 400, 700 and any desired feature of the circuit board 200, 400, 500—such as a side thereof). The pads, such as pads 1003 of FIG. 10, can be configured so as to accommodate a desired orientation.

Alternatively, the actuator 400 can be placed on the circuit board 500 with the arm 401 extending sideways, generally parallel to the circuit board 500, as shown in FIGS. 5 and 6. Alternatively, the actuator 700 can be placed on the circuit board 800 with the arm 701 extending downwardly, away from the circuit board 800, as shown in FIGS. 8 and 9.

A single actuator can have contacts formed up a plurality of surfaces thereof. For example, the actuator can have one set of contacts formed upon the bottom thereof (as shown in FIG. 1), another set of contacts formed upon the side thereof (as shown in FIG. 4), and yet another set of contacts formed upon the top thereof (as shown in FIG. 7, if the surface of the actuator 700 having the arm 701 extending therefrom is considered to be the top thereof, so as to be consistent with FIG. 1). The contacts can be redundant, such that any desired set can be used for surface mounting of the actuator. In this manner, a single actuator can be provided for use in a plurality of different orientations.

Thus, the single actuator can be configured to be mounted to a circuit board in any one of a variety of different orientations. For example, the actuator can be configured to be mounted to the circuit board with an arm thereof extending upwardly, extending sideways, or extending downwardly. That is, the actuator can have contacts formed upon any surface thereof.

The arm 101, 401, 701 can be considered to be an external part with respect to the actuator 100, 400, 700. The arm 101, 401, 701 moves with respect to the actuator 100, 400, 700. Since the actuator 100, 400, 700 has an external moving part, contemporary packaging technologies, such as ball grid array (BGA) and quad flat no-lead (QFN) cannot be used with surface mount technology (SMT) to mount the actuator 100, 400, 700 because the packaging technology would interfere with desired movement of the arm 101, 401, 701.

The actuator can have a footprint of approximately 0.5 mm×1.5 mm. This footprint is only slight larger than a standard 0402 surface mount component.

According to an embodiment, the actuator itself can define a package. Thus, features of the actuator can function as features of a package so as to facilitate mounting of the actuator. For example, contacts formed upon flexures of the actuator can facilitate surface mounting of the actuator to a substrate.

The actuator can be any type of MEMS actuator or non-MEMS actuator. Examples of MEMS actuators include comb drives, scratch drives, and thermal drives. Example of non-MEMS actuators are voice coil actuators and piezoelectric actuators. The discussion of a MEMS actuator herein is by way of example only.

The term "surface mounting", as used herein, can be defined to include various techniques of surface mounting technology (SMT). Examples of surface mounting techniques can include the use of flat contacts, leads, pins, and/or solder balls.

The contacts can be formed of any conductor or semiconductor material. The contacts can be formed of metal to facilitate the use of solder to surface mount the actuator to a substrate. For example, the contacts can be formed of aluminum nickel (Al/Ni) or titanium platinum nickel (Ti/Pt/Ni).

The metallization of the substrate can be patterned such that the actuator rotates when the solder melts. In this way, the actuator can be placed in one direction (e.g. flat) upon the substrate and can end upon at 90° with respect to this direction (such that the actuator is standing upright when mounted).

The use of surface mounting more readily facilitates the mounting of actuators, such as MEMS actuators, in different orientations. Since the actuators can be more readily mounted in different orientations, the actuators can be used in a variety of applications.

The flexures can accommodate substantial mismatches in the coefficient of expansion between the actuator and the substrate upon which the actuator is mounted. Such flexures can also mitigate stress applied to the actuator due to shock, vibration, handling (such as by a person handling a mounted part and/or automated placement equipment, e.g., pick and place equipment).

Each flexure can have one electrical contact formed thereon. Each flexure can have a plurality of electrical contacts formed thereon. One or more flexures can have dummy contacts formed thereon. Each dummy contact can facilitate mechanical mounting of the actuator without providing any electrical connection thereto. Some contacts can be on flexures and some contacts can be without flexures. Any combination of contacts and flexures can be used.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected is:

1. A device, comprising:
   a MEMS device; and
   a conductive contact on the MEMS device;
   wherein the MEMS device is configured to be coupled to external circuitry at least in part by an electrically conductive attachment between the conductive contact and the external circuitry, and
   wherein the MEMS device further comprises a flexure that isolates the MEMS device from stresses associated with the electrically conductive attachment, and wherein the conductive contact is formed on the flexure.

2. The device defined in claim 1, wherein the conductive contact comprises a solder contact and wherein the device further comprises a solder paste on the solder contact.

3. The device defined in claim 1, wherein a second conductive contact is formed on a portion of the MEMS device that is different from the flexure.

4. The device defined in claim 1, wherein the device comprises a camera incorporating the MEMS device and the external circuitry.

5. The device defined in claim 1, wherein the device comprises a portable electronic device incorporating the MEMS device and the external circuitry.

6. The device defined in claim 1, wherein the flexure is relatively stiff in a direction of motion of the MEMS device and relatively soft in a different direction.

7. A method, comprising:
   providing a MEMS device having a flexure with a conductive contact;
   providing an external circuit having a corresponding conductive contact;
   applying a solder paste on at least one of the conductive contact on the MEMS device and the corresponding conductive contact on the external circuit;
   reflowing the solder paste to mechanically and electrically attach the MEMS device to the external circuit, wherein the flexure isolates the MEMS device from stresses associated with the solder paste.

8. The method defined in claim 7, wherein the MEMS device comprises an actuator having an arm, the method further comprising:
   operating the actuator by moving the arm.

9. The method defined in claim 8, wherein the external circuit comprises a printed circuit that has an opening formed therein and wherein the moving comprises extending the arm from the actuator into the opening.

10. The method defined in claim 7, wherein the method further comprises:
    preventing a first motion of the MEMS device in a first direction with the flexure; and
    allowing a second motion of the MEMS device in a second direction with the flexure.

11. The method defined in claim 10, wherein the flexure is relatively stiff in the first direction and relatively soft in the second direction, wherein the MEMS device comprises an actuating arm, and wherein the method further comprises:
    moving the actuating arm in the first direction.

12. A device, comprising:
    a printed circuit;
    a MEMS device having a flexure with a conductive contact; and
    solder at least partially interposed between the printed circuit and the conductive contact of the MEMS device, wherein the solder attaches the MEMS device directly to the printed circuit,
    wherein the flexure isolates the MEMS device from stresses associated with the solder.

13. The device defined in claim 12, wherein the printed circuit comprises a printed circuit board.

14. The device defined in claim 13, wherein the solder attaches the MEMS device directly to the printed circuit in a fixed position with respect to the printed circuit board.

15. The device defined in claim 14, wherein the MEMS device comprises an actuator arm that is configured to move with respect to the fixed position.

16. The device defined in claim 13, wherein a surface of the MEMS device faces an opposing surface of the printed circuit board without any intervening structures other than the solder.

17. The device defined in claim 16, wherein the MEMS device comprises an actuator arm that extends from an additional surface of the MEMS device that is opposite to the surface of the MEMS device.

18. The device defined in claim 12, wherein the solder contact is soldered to the printed circuit by the solder, and wherein the flexure is comparatively stiff in a direction of motion of the MEMS device and the at least one flexure is comparatively soft in at least one other direction.

* * * * *